United States Patent
Lee et al.

(10) Patent No.: US 9,812,845 B1
(45) Date of Patent: Nov. 7, 2017

(54) FAST WAVELENGTH-TUNABLE HYBRID OPTICAL TRANSMITTER

(71) Applicant: Oracle International Corporation, Redwood Shores, CA (US)

(72) Inventors: Jin-Hyoung Lee, San Diego, CA (US); Xuezhe Zheng, San Diego, CA (US); Daniel Y. Lee, San Diego, CA (US); Ying Luo, San Diego, CA (US); Ashok V. Krishnamoorthy, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 15/357,452

(22) Filed: Nov. 21, 2016

(51) Int. Cl.
*G02B 6/293* (2006.01)
*H01S 5/50* (2006.01)
*H01S 5/10* (2006.01)
*H01S 5/06* (2006.01)
*H01S 5/0687* (2006.01)
*G02F 1/225* (2006.01)

(52) U.S. Cl.
CPC ........ *H01S 5/5027* (2013.01); *G02B 6/29343* (2013.01); *H01S 5/0612* (2013.01); *H01S 5/1071* (2013.01); *G02F 1/2257* (2013.01); *G02F 2203/70* (2013.01); *H01S 5/0687* (2013.01)

(58) Field of Classification Search
CPC . G02B 6/29343; H01S 5/5027; H01S 5/0612; H01S 5/1071
See application file for complete search history.

(56) References Cited

U.S. PATENT DOCUMENTS

| | | | |
|---|---|---|---|
| 8,027,587 B1* | 9/2011 | Watts | G02B 6/12007 359/107 |
| 9,559,484 B2* | 1/2017 | Morton | H01S 3/083 |
| 2006/0222039 A1* | 10/2006 | Yamazaki | H01S 5/0612 372/94 |

(Continued)

OTHER PUBLICATIONS

Kato et al., "32 ×32 full-mesh (1024 path) wavelength-routing WDM network based on uniform-loss cyclic-frequency arrayed-waveguide grating", Electronics Letter, Jul. 20, 2000, vol. 36, No. 15, p. 1294-1296.

*Primary Examiner* — Jerry Rahll
(74) *Attorney, Agent, or Firm* — Park, Vaughan, Fleming & Dowler LLP (57) ABSTRACT

An optical transmitter includes: a set of reflective semiconductor optical amplifiers (RSOAs) or other reflective gain media, a set of ring filters, a set of intermediate waveguides, a shared waveguide, a shared loop mirror, and an output waveguide. Each intermediate waveguide channels light from an RSOA in proximity to an associated ring filter to cause optically coupled light to circulate in the associated ring filter. The shared waveguide is coupled to the shared loop mirror, and is located in proximity to the set of ring filters, so that light circulating in each ring filter causes optically coupled light to flow in the shared waveguide. Each RSOA forms a lasing cavity with the shared loop reflector, wherein each lasing cavity has a different wavelength associated with a resonance of its associated ring filter. The output waveguide is optically coupled to the shared loop mirror and includes an electro-optical modulator.

20 Claims, 7 Drawing Sheets

(56) References Cited

U.S. PATENT DOCUMENTS

| | | | |
|---|---|---|---|
| 2008/0056311 A1* | 3/2008 | Takeuchi | H01S 5/0612 372/20 |
| 2010/0284649 A1* | 11/2010 | Ishii | G02F 1/0147 385/31 |
| 2011/0013654 A1* | 1/2011 | Yamazaki | H01S 5/0687 372/29.02 |
| 2012/0189025 A1* | 7/2012 | Zheng | H01S 5/1071 372/20 |
| 2014/0003761 A1* | 1/2014 | Dong | G02F 1/2257 385/3 |
| 2015/0222089 A1* | 8/2015 | Jeong | H01S 5/142 359/346 |
| 2015/0381301 A1* | 12/2015 | Jeong | G02B 6/29397 398/79 |
| 2016/0025926 A1* | 1/2016 | Taylor | H01P 3/026 385/14 |
| 2016/0047677 A1* | 2/2016 | Heidrich | G01N 21/7746 356/480 |
| 2017/0115454 A1* | 4/2017 | Oldenbeuving | G02B 6/29343 |
| 2017/0184788 A1* | 6/2017 | Taylor | G02B 6/29343 |

\* cited by examiner

FAST WAVELENGTH-TUNABLE HYBRID OPTICAL TRANSMITTER

GOVERNMENT LICENSE RIGHTS

This invention was made with U.S. government support under Agreement No. HR0011-08-9-0001 awarded by DARPA. The U.S. government has certain rights in the invention.

FIELD

The disclosed embodiments generally relate to the design of an optical transmitter. More specifically, the disclosed embodiments relate to the design of a fast wavelength-tunable hybrid optical transmitter that provides a broad wavelength-tuning range and a fast switching speed.

RELATED ART

Silicon photonics is a promising new technology that can potentially provide large communication bandwidth, low latency and low power consumption for inter-chip and intra-chip connections or optical links. In order to achieve such low-latency, high-bandwidth optical connectivity, a number of optical components are required, including: optical modulators, optical detectors, wavelength multiplexers/demultiplexers, optical sources and optical switches.

In particular, energy-efficient and cost-effective optical switches are required to make such optical connections practical in data centers and high-performance, data-intensive computing systems. One promising optical-switching approach is to use the unique wavelength routing capability of arrayed-waveguide-grating-routers (AWGR) with carrier wavelength switching at the source node. (See K. Kato, et al., "32×32 full-mesh (1024 path) wavelength routing WDM network based on uniform loss cyclic-frequency arrayed-waveguide grating," Electron. Lett., vol. 36, pp. 1294-1295, 2000.) However, to make this approach practical, an optical transmitter with fast wavelength tuning is needed to facilitate source-originated optical switching.

SUMMARY

The disclosed embodiments relate to a system that provides an optical transmitter. During operation, the system generates a set of optical signals by powering up a set of two or more reflective gain media (RGMs), wherein each RGM in the set comprises an active gain medium coupled to an associated reflector. Next, the system channels the generated optical signals through a set of intermediate waveguides, wherein each intermediate waveguide is attached to an RGM in the set of RGMs and channels light from the RGM in proximity to an associated ring filter in a set of ring filters to cause optically coupled light to circulate in the associated ring filter. The system then optically couples light, which is circulating within each ring filter in the set of ring filters, into a shared waveguide. The optically coupled light on the shared waveguide is then directed to a shared loop mirror, which reflects the directed light back down the shared waveguide. In this way, the shared loop mirror forms a separate lasing cavity with each RGM in the set of RGMs, wherein each lasing cavity includes the shared loop reflector, the shared waveguide, an associated ring filter in the set of ring filters, an associated intermediate waveguide in the set of intermediate waveguides and the RGM. Moreover, each lasing cavity has a different wavelength, which is associated with a resonance of the associated ring filter. Next, the system optically couples light from the shared loop mirror into an output waveguide. Finally, the system modulates the optically coupled light on the output waveguide based on an electrical input signal to produce a modulated output for the optical transmitter.

In some embodiments, each lasing cavity includes a thermo-optic coefficient (TOC) compensator comprising a section of compensation material. In these embodiments, the lasing cavity includes a length $l_{Si}$ through silicon, a length $l_C$ through the compensation material, and a length $l_{OGM}$ through the optical gain material, wherein the effective refractive index of silicon is $n_{Si}$, the effective refractive index of the compensation material is $n_C$, and the effective refractive index of the optical gain material is $n_{OGM}$. Moreover, the effective TOC of silicon is $dn_{Si}/dT$, the effective TOC of the compensation material is $dn_C/dT$, and the effective TOC of the optical gain material is $dn_{OGM}/dT$. Finally, $l_C \approx l_{OGM}*(dn_{OGM}/dT-dn_{Si}/dT)/(dn_{Si}/dT-dn_C/dT)$, whereby the effective TOC of a portion of the lasing cavity that passes through the optical gain material and the compensation material is substantially the same as the TOC of silicon.

In some embodiments, the set of RGMs are located on one or more gain chips, which are separate from a semiconductor chip that includes the set of intermediate waveguides, the set of ring filters, the shared waveguide, and the shared loop mirror.

In some embodiments, each ring filter in the set of ring filters includes a thermal-tuning mechanism.

In some embodiments, each ring filter in the set of ring filters comprises a dual-ring-based ring filter.

In some embodiments, each dual-ring-based ring filter includes two rings having different radii, which causes a Vernier effect that provides a combined tuning range that is larger than the gain bandwidth of an associated RGM.

In some embodiments, the shared loop mirror has a first port and a second port, wherein the first port is coupled to the shared waveguide, and the second port is coupled to the output waveguide, which feeds through the broadband modulator.

In some embodiments, the output waveguide has two ends that function as two outputs of the optical transmitter, wherein each of the two outputs feeds through a separate broadband modulator.

In some embodiments, the output waveguide has two ends, which feed into separate arms of a Mach-Zehnder modulator (MZM), which combines signals received from the two ends of the output waveguide to produce a single output.

The disclosed embodiments also relate to another optical transmitter, which includes: a set of a set of reflective gain media (RGMs), wherein each RGM in the set comprises an active gain medium coupled to an associated reflector, wherein the set of RGMs is divided into a first subset and a second subset, a set of ring filters divided into a first subset and a second subset, a set of intermediate waveguides, a first shared waveguide, a second shared waveguide, a shared loop mirror including a directional coupler with a first port and a second port, and an output waveguide. Each of the intermediate waveguides channels light from an RGM in the set of RGMs in proximity to an associated ring filter in the set of ring filters to cause optically coupled light to circulate in the associated ring filter. The first shared waveguide is coupled to the first port of the shared loop mirror, and is located in proximity to the first subset of ring filters, so that light circulating in each ring filter in the first subset causes optically coupled light to flow in the first shared waveguide. Similarly, the second shared waveguide is coupled to the second port of the shared loop mirror, and is located in proximity to the second subset of ring filters, so that light circulating in each ring filter in the second subset causes optically coupled light to flow in the second shared waveguide. Note that each RGM forms a lasing cavity with the shared loop reflector, wherein each lasing cavity has a different wavelength, which is associated with a resonance of the associated ring filter. Finally, the output waveguide is optically coupled to the shared loop mirror and includes an electro-optical modulator.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Throughout this specification and in the appended claims we use the term "gain medium" (GM) to refer any device, which contains active gain material and can be used to power a laser. This can include but is not limited to: a semiconductor optical amplifier (SOA), an active device fabricated using a quantum-dot gain material, and an active device fabricated in a nonlinear fiber gain medium. We also use the term "reflective gain medium" (RGM) to refer to any type of active gain material, which is coupled to an associated reflector. This can include, but is not limited to: a reflective semiconductor optical amplifier (RSOA), and an SOA that can be accessed through both ends and looped either as: (1) a loop mirror coupled to a reflective end of the SOA, or (2) a loop containing the SOA before the SOA. (This geometry changes the structure to the extent that light passes in a single pass through both directions in the SOA, just like a double pass through an RSOA, and provides gain.) Note that the loop mirror recited above can alternatively be replaced with a distribute Bragg reflector (DBR).

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Implementation Details

Figure 1:
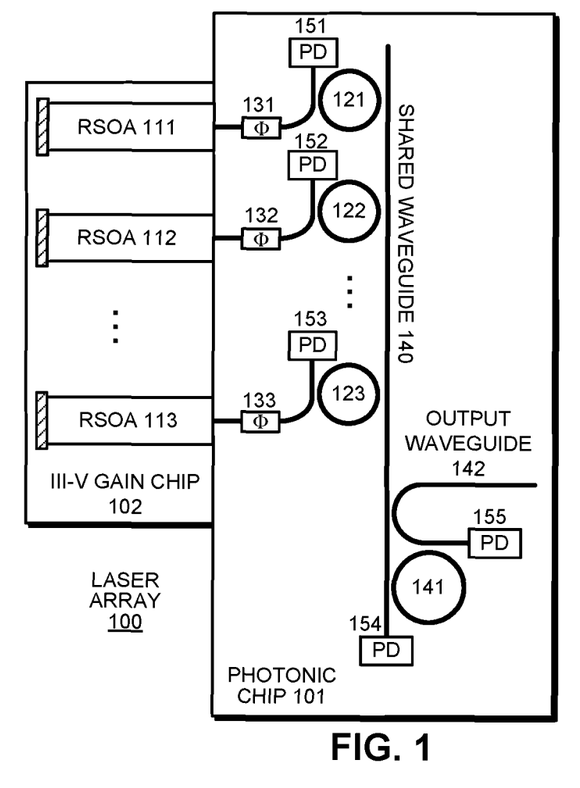
FIG. 1 illustrates a multiple wavelength ring-based laser source in accordance with the disclosed embodiments.

FIG. 1 illustrates a recently developed hybrid wavelength division multiplexed (WDM) laser array 100. (See U.S. patent application Ser. No. 15/047,090, entitled "Ring-Resonator Based Laser with Multiple Wavelengths," by inventors Jock T. Bovington and Xuezhe Zheng, filed on 18 Feb. 2016, which is hereby incorporated herein by reference in its entirety.) Laser array 100 comprises a cascaded array of channel rings 121-123 and a shared ring reflector 141 coupled together through a shared waveguide 140 to form a wavelength-selective reflector array located on photonic chip 101, which is coupled to RSOAs 111-113 located on a III-V gain chip 102 using hybrid integration. Laser array 100 also includes an output waveguide 142 with an associated photo-detector 155, which is optically coupled to the shared waveguide 140 and/or the shared ring reflector 141. The shared ring reflector 141 illustrated in FIG. 1 serves two purposes: (1) it functions as a shared second mirror for each of the individual lasing cavities; and (2) it defines the lasing wavelength spacing for the laser array.

Laser array 100 has two operating modes. In a comb-source operating mode, laser array 100 can provide a comb source by turning on all of the RSOAs 111-113 and aligning each of the channel rings 121-123 with one of the resonance modes of the shared ring reflector 141. In a single-wavelength operating mode, only one of the RSOAs 111-113 is turned on at a given time while maintaining the alignment between the channel rings 121-123 and the shared ring resonances. Note that because the laser cavities in laser array 100 are not identical, additional channel-specific phase tuners 131-133 can be needed to further align the nearest cavity mode with the aligned resonances of each channel ring and the shared ring reflector 141, and these phase tuners 131-133 can consume a significant amount of tuning power. Moreover, the control system for the laser array 100 illustrated in FIG. 1 will be quite complex because there are three tuning elements in each control loop. In addition, the shared ring reflector 141 is used by all the lasing cavities. This is a concern because shared ring reflector 141 can potentially exceed a maximum power and become unstable when all the wavelength channels are turned on simultaneously.

Figure 2:
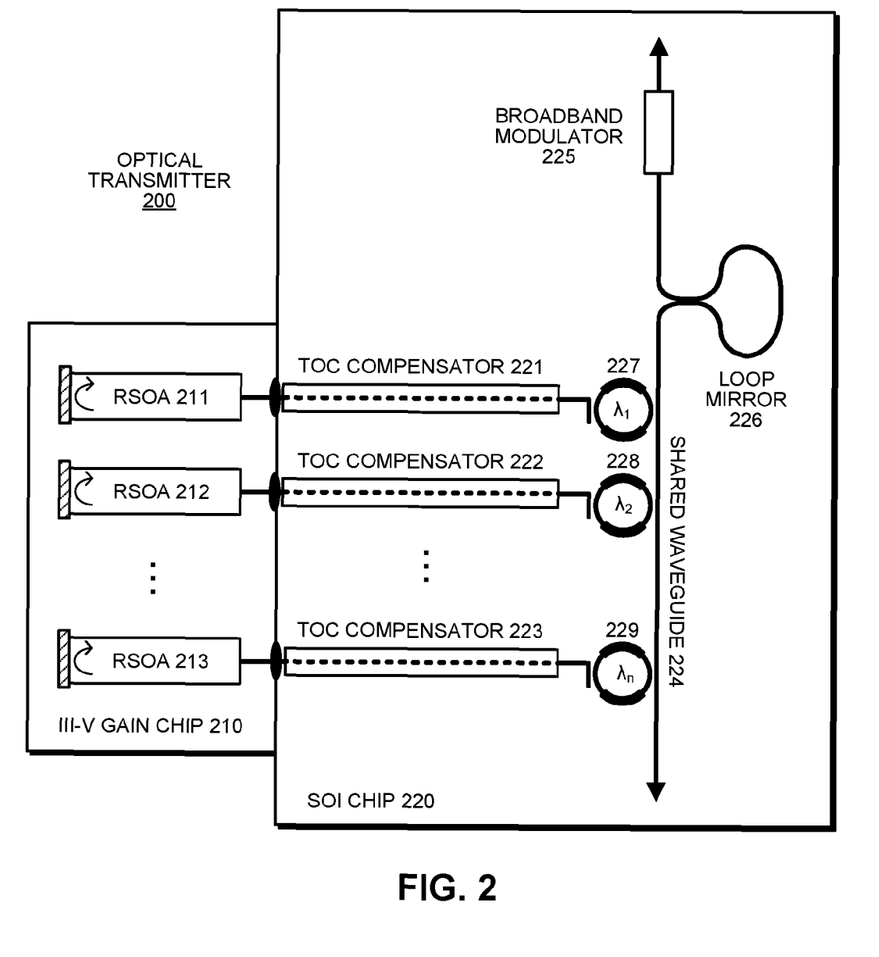
FIG. 2 illustrates a fast wavelength-tunable hybrid optical transmitter in accordance with the disclosed embodiments.

To overcome the above-described disadvantages of laser array 100 illustrated in FIG. 1, we have developed a new simplified fast-tunable hybrid laser source that requires neither the shared ring reflector 141 nor the phase tuners 131-133. As illustrated in FIG. 2, this new simplified laser source is implemented as an optical transmitter 200, which comprises a III-V gain chip 210 that includes multiple RSOAs 211-213 that is integrated with a silicon circuit located on silicon-on insulator (SOI) chip 220. This silicon circuit comprises a cascaded array of ring filters 227-229 that are optically coupled to a shared waveguide 224, which feeds into a larger shared loop mirror 226.

Note that each of the ring filters 227-229 is designed with a small difference in radius such that its resonance is spaced one predetermined channel spacing away from its neighbors for the same resonance order in the wavelength band of interest. Moreover, the loop mirror 226 and the high reflection (HR) facets of the RSOAs 211-213 form partially shared but independent lasing cavities for the different wavelength channels. Within the gain bandwidth of each of the RSOAs 211-213, the associated narrow-band ring filter defines the lasing wavelength by having its resonance aligned to one of the cavity modes nearby. While optical transmitter 200 is operating in a comb-source mode, a comb of lasing wavelengths can be achieved through a combination of ring radius offsets and ring-resonance tuning (using an integrated phase tuner) with a channel-spacing error of no more than one cavity-mode spacing. In addition, by using a broadband modulator 225 at the output, a tunable III-V/Si hybrid optical transmitter 200 can be implemented with fast wavelength tuning and reduced tuning power.

Also, by including passive thermo-optic coefficient (TOC) compensators 221-223 in each channel, fast wavelength tuning can be achieved without the need to provide closed-loop control for lasing mode locking after an initial ring alignment. Because of the different thermo-optic coefficients (TOCs) of silicon and the III-V gain material, the position of the laser cavity modes will drift at a different rate from those of the ring resonances when the ambient temperature changes. This can cause "walk-offs" between the aligned ring resonances and the lasing cavity mode if the ambient temperature changes significantly, which will result in mode-hopping that is potentially fatal in high-speed communication links. The mode-hopping problem can be solved by using an active closed-loop feedback control system. However, this will not prevent drift of the entire array as the ambient temperature changes because each of the wavelength channels in the array will vary with temperature at a rate of approximately 0.08 nm/° C. This drift can potentially create a large tuning-range requirement for each ring (or dual-ring pair for the embodiment illustrated in FIG. 4). An elegant solution to remove the aforementioned "walk-offs" between the ring resonance and the lasing cavity mode and related tuning requirements is to add simple TOC compensators 221-223 having properly selected lengths to the lasing cavities, which can effectively eliminate temperature-induced mode-hopping. (See U.S. patent application Ser. No. 15/292,501, entitled "Surface-Normal Optical Coupling Interface with Thermal-Optic Coefficient Conversion," by inventors Ying L. Luo, Xuezhe Zheng and Ashok V. Krishnamoorthy, filed 13 Oct. 2016, which is incorporated by reference herein.)

Note that TOC compensators 221-223 can be implemented using a SiON waveguide (or another material with a thermo-optic coefficient lower than silicon) with proper low-loss transition to the silicon waveguides. Assume the effective lengths of the three materials Si, SiON and III-V in the hybrid cavity are $L_1$, $L_2$, and $L_3$, their refractive indices are $n_1$, $n_2$, and $n_3$, and their thermo-optic coefficients are $dn_1/dT$, $dn_2/dT$ and $dn_3/dT$, respectively. The changes in optical path length of the cavity mode $\Delta nL$ due to temperature variation $\Delta T$ can be expressed as $$\Delta nL = (dn_1/dT^*L_1 + dn_2/dT^*L_2 + dn_3/dT^*L_3)^*\Delta T.$$

We can make the average do/dT of the hybrid cavity equal to $dn_1/dT$ by choosing $$L_2 = (dn_3/dT - dn_1/dT)/(dn_1/dT - dn_2/dT)^*L_3.$$

By implementing a TOC compensator waveguide with the correct length for each channel, the cavity modes will drift at the same pace as the silicon ring-filter Hence, once the initial alignment is done, no further active tuning control is required to keep the hybrid laser from mode-hopping due to TOC mismatch. In the event that the TOC compensation is imperfect and some residual drift versus temperature occurs, each ring filter 227-229 can be locally monitored and controlled to ensure that they operate free of mode-hopping. However, note that because the rings are located in close proximity to each other on the silicon photonic substrate, the effective comb wavelengths will tend to move in unison as a result of temperature variations. Hence, by using TOC compensators 221-223, wavelength separation can be increased, and crosstalk can be reduced.

In a single-wavelength mode of operation, by providing integrated TOCs 221-223 for each channel, and by keeping ring filters aligned with their desired corresponding cavity modes, fast wavelength switching can be achieved by selectively turning on only the RSOA for the wavelength channel of interest, and leaving the other RSOAs turned off. Moreover, as mentioned above, adding the broadband modulator 225 to the output of loop mirror 226 creates a fast-tuning optical transmitter 200. Note that broadband modulator 225 can be implemented in a number of ways, such as by using an MZI modulator, or an electro-optic (EO) modulator, such as a SiGe Franz-Keldish modulator.

Figure 3:
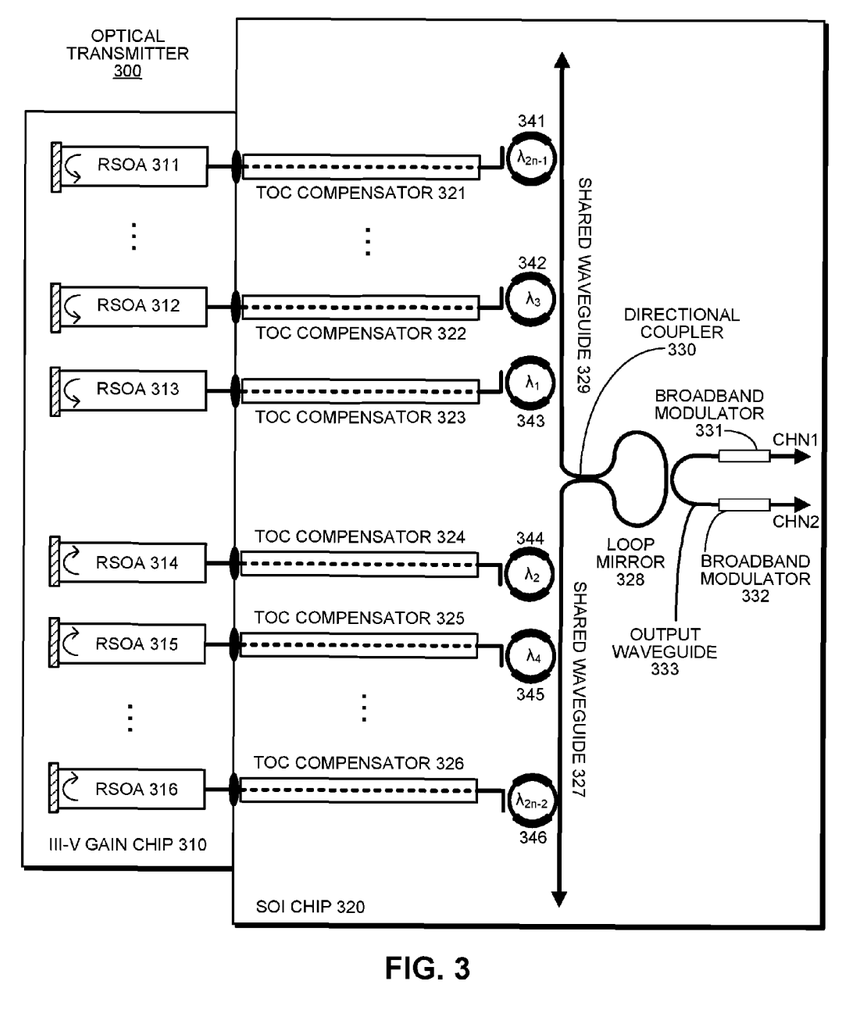
FIG. 3 illustrates a fast wavelength-tunable hybrid optical transmitter with additional wavelength channels in accordance with the disclosed embodiments.

To scale up the number of wavelength channels, one can simply add cascaded channels to shared waveguide 224 in FIG. 2. However, the imperfect coupling between the rings and the shared waveguide 224, and the crosstalk among the ring filter channels 227-229 can give rise to increased cavity loss due to the added channels. Another way to scale up the number of wavelength channels is to add a second set of cascaded channels on the other side of a loop mirror 328, which is associated with 50/50 directional coupler 330, as is shown in optical transmitter 300 illustrated in FIG. 3. As illustrated in FIG. 3, a first subset of ring filters 341-343 is optically coupled to a first shared waveguide 329 that feeds into a first port of directional coupler 330. Similarly, a second subset of ring filters 344-346 is optically coupled to a second shared waveguide 327 that feeds into a second port of directional coupler 330. Ring filters 341-346 are also optically coupled to corresponding RSOAs 311-316 through TOC compensators 321-326, respectively. Finally, an output waveguide 333 is optically coupled to the loop mirror 328.

Note that the output power of the laser source is evenly split between the two ends of output waveguide 333, and can be used to source two modulator channels that feed through associated broadband modulators 331-332. Note that the added III-V RSOAs can use a gain material in a different wavelength band. Or, alternatively, they can use the same gain material, in which case the rings on both sides of the loop mirror will be designed with their resonances in an interleaved fashion to minimize channel crosstalk.

Figure 4:
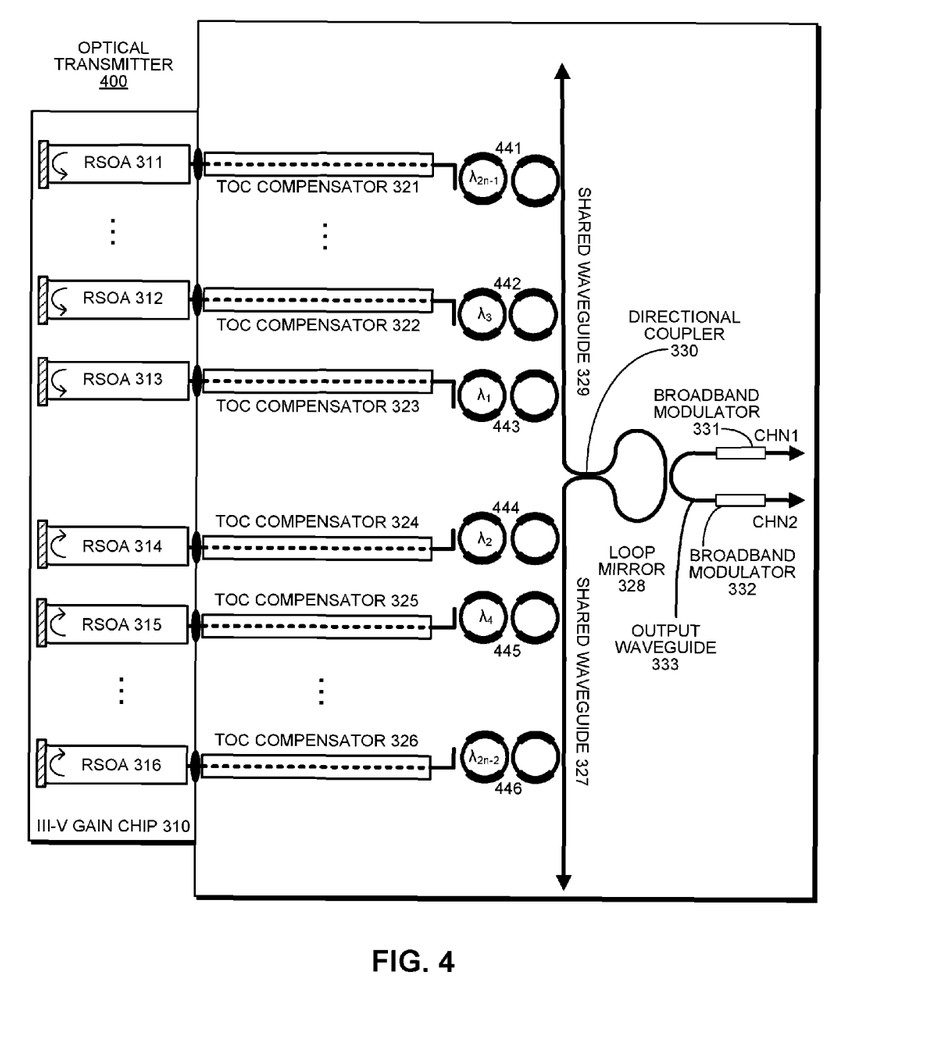
FIG. 4 illustrates a fast wavelength-tunable hybrid optical transmitter that includes Vernier dual-ring filters in accordance with the disclosed embodiments.

Because each single ring-filter 341-346 has a limited FSR, there is a potential risk of FSR mode-hopping due to the broad gain bandwidth of the III-V gain material. To remedy this problem, the single-ring filters 341-346 in FIG. 3 can be replaced with coupled dual rings or cascaded dual-ring filters 441-446, wherein the dual rings have different radii as is illustrated in FIG. 4. Note that using dual-ring filters can significantly increase the FSR because of the Vernier effect between each dual ring pair.

Figure 5:
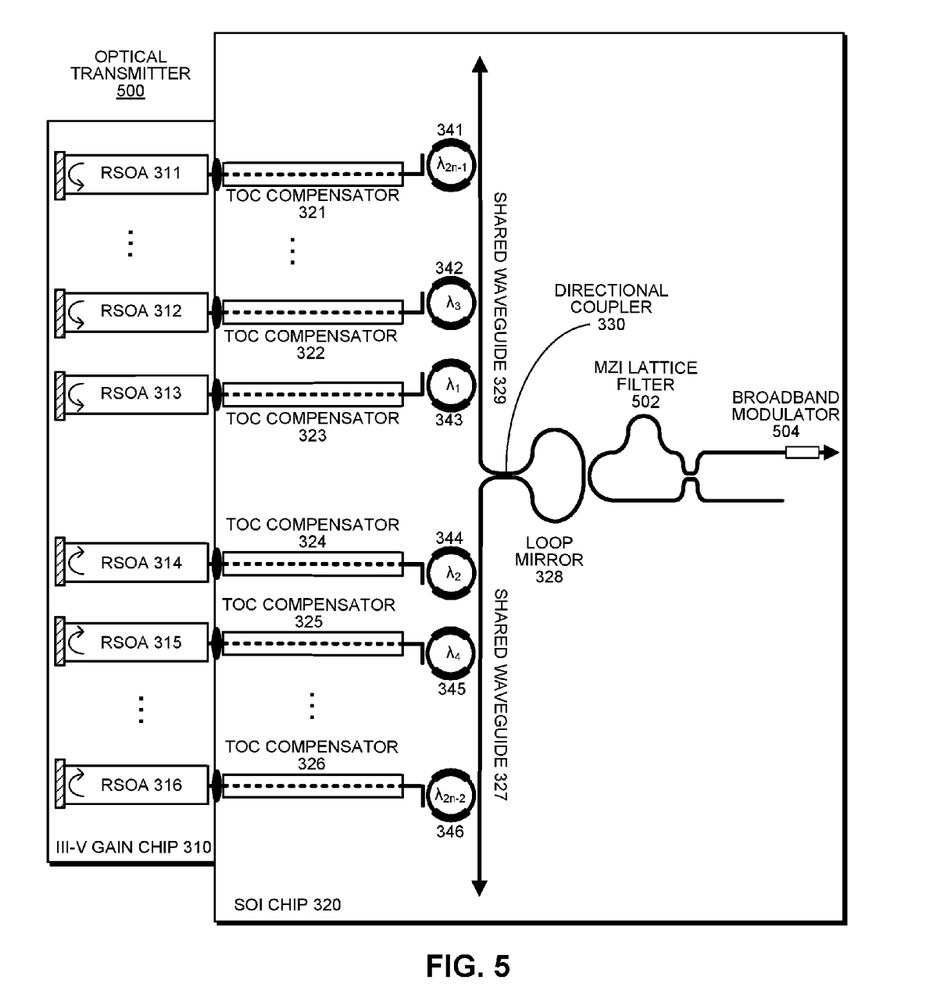
FIG. 5 illustrates a fast wavelength-tunable hybrid optical transmitter with an integrated multiplexer in accordance with the disclosed embodiments.

In another embodiment, it is desired to have all the laser output in one output waveguide. To accomplish this, an MZI lattice filter 502 can be added to the output of the laser to multiplex both the top and bottom wavelength channels into a single output waveguide that feeds through a broad-band modulator 504 as is depicted in optical transmitter 500, which is illustrated in FIG. 5. In this embodiment, the single-ring filters 341-346 can similarly be replaced with coupled dual rings or cascaded dual rings with different radii for increased FSR using the Vernier effect.

Operation

Figure 6:
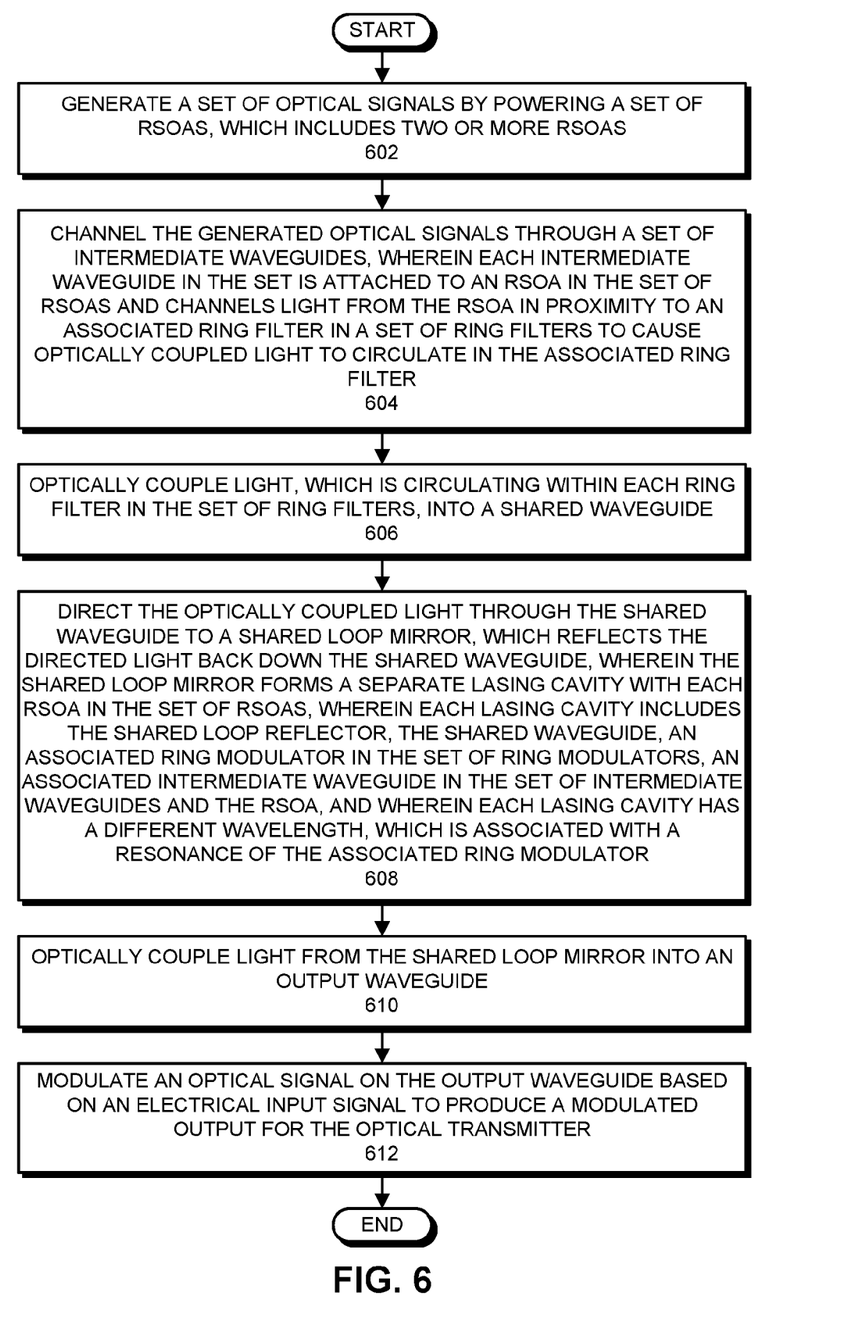
FIG. 6 presents a flow chart illustrating actions performed during operation of the optical transmitter in accordance with the disclosed embodiments.

During operation, the hybrid optical transmitter system described above operates as illustrated in the flow chart that appears in FIG. 6. First, the system generates a set of optical signals by powering a set of RSOAs, which includes two or more RSOAs (step 602). Next, the system channels the generated optical signals through a set of intermediate waveguides, wherein each intermediate waveguide in the set is attached to an RSOA in the set of RSOAs and channels light from the RSOA in proximity to an associated ring filter in a set of ring filters to cause optically coupled light to circulate in the associated ring filter (step 604). The system then optically couples light, which is circulating within each ring filter in the set of ring filters, into a shared waveguide (step 606). Next, the system directs the optically coupled light through the shared waveguide to a shared loop mirror, which reflects the directed light back down the shared waveguide, wherein the shared loop mirror forms a separate lasing cavity with each RSOA in the set of RSOAs, wherein each lasing cavity includes the shared loop reflector, the shared waveguide, an associated ring filter in the set of ring filters, an associated intermediate waveguide in the set of intermediate waveguides and the RSOA, and wherein each lasing cavity has a different wavelength, which is associated with a resonance of the associated ring filter (step 608). Next, the system optically couples light from the shared loop mirror into an output waveguide (step 610). Finally, the system modulates an optical signal on the output waveguide based on an electrical input signal to produce a modulated output for the optical transmitter (step 612).

System

Figure 7:
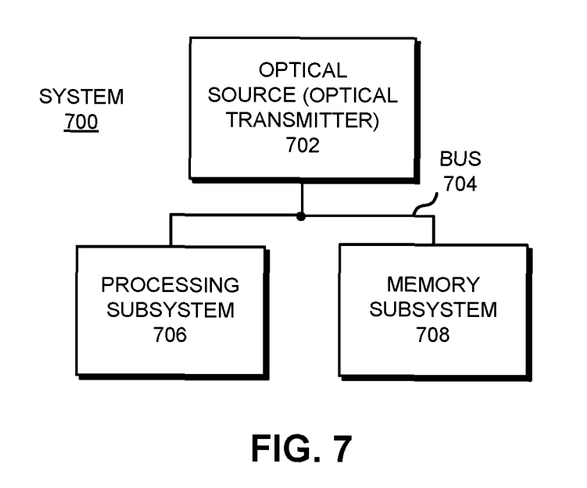
FIG. 7 illustrates a system that includes an optical source, such as an optical transmitter, in accordance with an embodiment of the present disclosure.

One or more of the preceding embodiments of the tunable laser may be included in a system or device. More specifically, FIG. 7 illustrates a system 700 that includes an optical source 702, which includes an optical transmitter. System 700 also includes a processing subsystem 706 (with one or more processors) and a memory subsystem 708 (with memory).

In general, components within optical source 702 and system 700 may be implemented using a combination of hardware and/or software. Thus, system 700 may include one or more program modules or sets of instructions stored in a memory subsystem 708 (such as DRAM or another type of volatile or non-volatile computer-readable memory), which, during operation, may be executed by processing subsystem 706. Furthermore, instructions in the various modules in memory subsystem 708 may be implemented in: a high-level procedural language, an object-oriented programming language, and/or in an assembly or machine language. Note that the programming language may be compiled or interpreted, e.g., configurable or configured, to be executed by the processing subsystem.

Components in system 700 may be coupled by signal lines, links or buses, for example bus 704. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 700 may be at one location or may be distributed over multiple, geographically dispersed locations.

System 700 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, optical source 702 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. An optical transmitter, comprising:
   a set of two or more reflective gain media (RGMs), wherein each RGM in the set comprises an active gain medium coupled to an associated reflector;
   a set of ring filters organized into a cascaded array;
   a set of intermediate waveguides, wherein each intermediate waveguide in the set is coupled to an RGM in the set of RGMs, and channels light from the RGM in proximity to an associated ring filter in the set of ring filters to cause optically coupled light to circulate in the associated ring filter;
   a shared waveguide located in proximity to the set of ring filters, so that light circulating in each ring filter in the set of ring filters causes optically coupled light to flow in the shared waveguide;
   a shared loop mirror coupled to the shared waveguide; and
   an output waveguide, which is optically coupled to the shared loop mirror, wherein the output waveguide includes a broadband modulator that modulates an optical signal based on an electrical input signal;
   wherein each RGM in the set of RGMs forms a lasing cavity, which includes an associated intermediate waveguide in the set of intermediate waveguides, an associated ring filter in the set of ring filters, the shared waveguide and the shared loop mirror, wherein each lasing cavity has a different wavelength, which is associated with a resonance of the associated ring filter.

2. The optical transmitter of claim 1,
   wherein each lasing cavity includes a thermo-optic coefficient (TOC) compensator comprising a section of compensation material;
   wherein the lasing cavity includes a length $l_{Si}$ through silicon, a length $l_C$ through the compensation material, and a length $l_{OGM}$ through the optical gain material;
   wherein the effective refractive index of silicon is $n_{Si}$, the effective refractive index of the compensation material is $n_C$, and the effective refractive index of the optical gain material is $n_{OGM}$;
   wherein the effective TOC of silicon is $dn_{Si}/dT$, the effective TOC of the compensation material is $dn_C/dT$, and the effective TOC of the optical gain material is $dn_{OGM}/dT$; and
   wherein $l_C \approx l_{OGM}*(dn_{OGM}/dT - dn_{Si}/dT)/(dn_{Si}/dT - dn_C/dT)$, whereby the effective TOC of a portion of the lasing cavity that passes through the optical gain material and the compensation material is substantially the same as the TOC of silicon.

3. The optical transmitter of claim 1, wherein the set of RGMs are located on one or more gain chips, which are separate from a semiconductor chip that includes the set of intermediate waveguides, the set of ring filters, the shared waveguide, and the shared loop mirror.

4. The optical transmitter of claim 1, wherein each ring filter in the set of ring filters includes a thermal-tuning mechanism.

5. The optical transmitter of claim 1, wherein each ring filter in the set of ring filters comprises a dual-ring-based ring filter.

6. The optical transmitter of claim 5, wherein each dual-ring-based ring filter includes two rings having different radii, which causes a Vernier effect that provides a combined tuning range that is larger than the gain bandwidth of an associated RGM.

7. The optical transmitter of claim 1,
   wherein the shared loop mirror has a first port and a second port;
   wherein the first port is coupled to the shared waveguide; and
   wherein the second port is coupled to the output waveguide, which feeds through the broadband modulator.

8. The optical transmitter of claim 1,
   wherein the output waveguide is optically coupled to the shared loop mirror;
   wherein the output waveguide has two ends that function as two outputs of the optical transmitter; and
   wherein each of the two outputs feeds through a separate broadband modulator.

9. The optical transmitter of claim 1,
   wherein the output waveguide is optically coupled to the shared loop mirror; and
   wherein the output waveguide has two ends, which feed into separate arms of a Mach-Zehnder modulator (MZM), which combines signals received from the two ends of the output waveguide to produce a single output.

10. An optical transmitter, comprising:
    a set of two or more reflective gain media (RGMs), wherein each RGM in the set comprises an active gain medium coupled to an associated reflector;
    a set of ring filters, including a first subset of ring filters associated with the first subset of RGMs, and a second subset of ring filters associated with the second subset of RGMs;
    a set of intermediate waveguides, wherein each intermediate waveguide is attached to an RGM in the set of RGMs, and channels light in proximity to an associated ring filter in the set of ring filters to cause optically coupled light to circulate in the associated ring filter;
    a first shared waveguide located in proximity to the first subset of ring filters, so that light circulating in each ring filter in the first subset of ring filters causes optically coupled light to flow in the first shared waveguide;
    a second shared waveguide located in proximity to the second subset of ring filters, so that light circulating in each ring filter in the second subset of ring filters causes optically coupled light to flow in the second shared waveguide;
    a shared loop mirror including a directional coupler with a first port and a second port, wherein the first port is coupled to the first shared waveguide, and the second port is coupled to the second shared waveguide; and
    an output waveguide, which is optically coupled to the shared loop mirror, wherein the output waveguide includes a broadband modulator that modulates an optical signal based on an electrical input signal;
    wherein each RGM in the set of RGMs forms a lasing cavity, which includes an associated intermediate waveguide in the set of intermediate waveguides, an associated ring filter in the set of ring filters, an associated shared waveguide, and the shared loop mirror, wherein each lasing cavity has a different wavelength, which is associated with a resonance of the associated ring filter.

11. The optical transmitter of claim 10,
wherein each lasing cavity includes a thermo-optic coefficient (TOC) compensator comprising a section of compensation material;
wherein the lasing cavity includes a length $l_{Si}$ through silicon, a length $l_C$ through the compensation material, and a length $l_{OGM}$ through the optical gain material;
wherein the effective refractive index of silicon is $n_{Si}$, the effective refractive index of the compensation material is $n_C$, and the effective refractive index of the optical gain material is $n_{OGM}$;
wherein the effective TOC of silicon is $dn_{Si}/dT$, the effective TOC of the compensation material is $dn_C/dT$, and the effective TOC of the optical gain material is $dn_{OGM}/dT$; and
wherein $l_C \approx l_{OGM}*(dn_{OGM}/dT - dn_{Si}/dT)/(dn_{Si}/dT - dn_C/dT)$, whereby the effective TOC of a portion of the lasing cavity that passes through the optical gain material and the compensation material is substantially the same as the TOC of silicon.

12. The optical transmitter of claim 10, wherein the set of RGMs are located on one or more gain chips, which are separate from a semiconductor chip that includes the set of intermediate waveguides, the set of ring filters, the shared waveguide, and the shared loop mirror.

13. The optical transmitter of claim 10, wherein each ring filter in the set of ring filters includes a thermal-tuning mechanism.

14. The optical transmitter of claim 10, wherein each ring filter in the set of ring filters comprises a dual-ring-based ring filter.

15. The optical transmitter of claim 14, wherein each dual-ring-based ring filter includes two rings having different radii, which causes a Vernier effect that provides a combined tuning range that is larger than the gain bandwidth of an associated RGM.

16. The optical transmitter of claim 10,
wherein the output waveguide is optically coupled to the shared loop mirror;
wherein the output waveguide has two ends that function as two outputs of the optical transmitter; and
wherein each of the two outputs feeds through a separate broadband modulator.

17. The optical transmitter of claim 10,
wherein the output waveguide is optically coupled to the shared loop mirror; and
wherein the output waveguide has two ends, which feed into separate arms of a Mach-Zehnder modulator (MZM), which combines signals received from the two ends of the output waveguide to produce a single output.

18. A method for operating an optical transmitter, comprising:
generating a set of optical signals by powering a set of two or more reflective gain media (RGMs), wherein each RGM in the set comprises an active gain medium coupled to an associated reflector;
channeling the generated optical signals through a set of intermediate waveguides, wherein each intermediate waveguide in the set is attached to an RGM in the set of RGMs and channels light from the RGM in proximity to an associated ring filter in a set of ring filters to cause optically coupled light to circulate in the associated ring filter;
optically coupling light, which is circulating within each ring filter in the set of ring filters, into a shared waveguide;
directing the optically coupled light through the shared waveguide to a shared loop mirror, which reflects the directed light back down the shared waveguide, wherein the shared loop mirror forms a separate lasing cavity with each RGM in the set of RGMs, wherein each lasing cavity includes the shared loop reflector, the shared waveguide, an associated ring filter in the set of ring filters, an associated intermediate waveguide in the set of intermediate waveguides and the RGM, and wherein each lasing cavity has a different wavelength, which is associated with a resonance of the associated ring filter;
optically coupling light from the shared loop mirror into an output waveguide; and
modulating an optical signal on the output waveguide based on an electrical input signal to produce a modulated output for the optical transmitter.

19. The method of claim 18,
wherein each lasing cavity includes a thermo-optic coefficient (TOC) compensator comprising a section of compensation material;
wherein the lasing cavity includes a length $l_{Si}$ through silicon, a length $l_C$ through the compensation material, and a length $l_{OGM}$ through the optical gain material;
wherein the effective refractive index of silicon is $n_{Si}$, the effective refractive index of the compensation material is $n_C$, and the effective refractive index of the optical gain material is $n_{OGM}$;
wherein the effective TOC of silicon is $dn_{Si}/dT$, the effective TOC of the compensation material is $dn_C/dT$, and the effective TOC of the optical gain material is $dn_{OGM}/dT$; and
wherein $l_C \approx l_{OGM}*(dn_{OGM}/dT - dn_{Si}/dT)/(dn_{Si}/dT - dn_C/dT)$, whereby the effective TOC of a portion of the lasing cavity that passes through the optical gain material and the compensation material is substantially the same as the TOC of silicon.

20. The method of claim 18, wherein each ring filter in the set of ring filters comprises a dual-ring-based ring filter.

* * * * *

UNITED STATES PATENT AND TRADEMARK OFFICE
CERTIFICATE OF CORRECTION

PATENT NO. : 9,812,845 B1
APPLICATION NO. : 15/357452
DATED : November 7, 2017
INVENTOR(S) : Lee et al.

Page 1 of 1

It is certified that error appears in the above-identified patent and that said Letters Patent is hereby corrected as shown below:

In the Specification

In Column 6, Line 18, delete "do/dT" and insert -- dn/dT --, therefor.

In Column 6, Line 48, delete "Franz-Keldish" and insert -- Franz-Keldysh --, therefor.

Signed and Sealed this
Twelfth Day of June, 2018

Andrei Iancu
*Director of the United States Patent and Trademark Office*